United States Patent [19]
Ochiai

[11] Patent Number: 5,943,583
[45] Date of Patent: Aug. 24, 1999

[54] METHOD FOR MANUFACTURING SEMICONDUCTOR DEVICE

[75] Inventor: Akihiko Ochiai, Kanagawa, Japan

[73] Assignee: Sony Corporation, Tokyo, Japan

[21] Appl. No.: 08/887,702

[22] Filed: Jul. 3, 1997

[30] Foreign Application Priority Data

Jul. 4, 1996 [JP] Japan .................................. 8-174912

[51] Int. Cl.⁶ .................................................. H01L 21/20
[52] U.S. Cl. ......................... 438/396; 438/399; 438/240; 438/239
[58] Field of Search ............................. 438/3, 240, 424, 438/612, 239, 253, 396, 399, 256; 257/310

[56] References Cited

U.S. PATENT DOCUMENTS 5,122,477  6/1992  Wolters et al. ........................ 437/60
5,498,569  3/1996  Eastep ................................... 438/3

OTHER PUBLICATIONS

S. Wolf and R.N. Tabuber, Diffusion in Silicon Dioxide, Silicon Processing for the VLSI Era vol. I Process Technology, p. 262, 1986.

*Primary Examiner*—Charles Bowers
*Assistant Examiner*—Scott V. Hauranek
*Attorney, Agent, or Firm*—Hill & Simpson

[57] ABSTRACT

The present invention provides a method for manufacturing a semiconductor device, including a step of forming an opening 1 such as a contact hole and a succeeding heat treatment step such as contact annealing, wherein the heat treatment is performed upon completion of filling the opening with a diffusion-preventing film 9 or the like. The method according to the present invention is free from disadvantages due to diffusion of a diffusible material during a heat treatment step performed after the step of forming an opening even if the method is applied to manufacture of a semiconductor device having a structure in which a diffusible material 2 such as a dielectric material used in a capacitor may diffuse through the opening due to heat during such a heat treatment step.

8 Claims, 3 Drawing Sheets

METHOD FOR MANUFACTURING SEMICONDUCTOR DEVICE

BACKGROUND OF THE INVENTION

1. Field of the Invention

The present invention relates to methods for manufacturing semiconductor devices. More particularly, the present invention relates to a method for manufacturing a semiconductor device, wherein said method includes a step of forming an opening such as a contact hole and a succeeding heat treatment step such as a contact annealing for activating ion-implanted impurities in the bottom of the opening, and is advantageous for manufacture of a semiconductor device having a structure in which a diffusible material such as a dielectric material used in a capacitor may diffuse through such an opening due to heat during such heat treatment.

2. Description of the Related Art

In many cases, methods for manufacturing semiconductor devices require heat treatment after a step of forming openings. For example, in a method for manufacturing a semiconductor device which has an ordinary structure such as an LSI carrying a MOS transistor, supplemental-ion implantation for improving the junction properties and heat treatment such as at 800° C. or higher for activating the implanted ions are required after the step of forming a contact hole on a diffusion layer of the transistor. During such heat treatment, diffusion through the contact hole into the inside of the semiconductor substrate frequently occurs due to heating. For example, in a structure having a capacitor, the composition of a dielectric material 2 (especially, ferroelectric material) as a component of a capacitor 3 may invade the semiconductor substrate 4 (silicon substrate) and a gate insulating film 5 (gate oxide film) through a contact hole as an opening 1, as shown in FIG. 5. The example shown in FIG. 5 is a FE (Ferro-Electric) RAM including a MOS transistor Tr and a capacitor 3, and especially, a capacitor 3 in which a ferroelectric material is used as a dielectric material 2. In a structure using such a ferroelectric material, diffusion of elements as components of the ferroelectric material through the opening 1 is a marked problem. Actually, although PZT (Pb—Zr—Ti-based materials) and SBT (Sr—Bi—Ta-based materials) are used as typical ferroelectric materials used in FE-RAMs, the component elements in these materials are vaporized at 800° C., and especially, Bi had been reported as vaporizable even at 600° C. Similar problems also may occur in DRAMs which include highly dielectric materials such as BST (Ba—Sr—Ti—O-based materials) and STO (Sr—Ti—O-based materials).

Although the diffusion pathway of a diffusible material 2 through such an opening 1 is not necessarily clear, the following manner as schematically shown in FIG. 5 with a dotted line and an arrowhead D is considered as predominant: The diffusible material 2 diffuses in an interlayer insulating film 63 (comprising silicon dioxide or the like) formed on a capacitor 3 so as to cover the capacitor 3, and then is vaporized to reach a diffusion layer 8. It may also partially invade a substrate 4 and a gate insulating film 5 by passing through the interlayer insulating film 63, externally or internally along the side wall of the opening 1, or along the interface between the side wall of the opening 1 and the atmospheric substances inside the opening.

Such diffusion can be disadvantageous since it may cause, for example, property change and reliability deterioration in transistors. Specifically, increase in junction leakage, reduction in gate breakdown voltage, and change in the threshold can be caused. As in VLSI and ULSI, semiconductor devices are manufactured with increasing fineness, giving them denser structures. Due to this, such unnecessary diffusion through an opening such as a contact hole increasingly develops problems.

Such problems must be solved for any method of manufacturing a semiconductor device in which a heat treatment is performed after an opening is formed, and the device has a structure containing a diffusible material capable of diffusing through the opening due to heat during the heat treatment.

Incidentally, in FIG. 5, the numerals 31 and 32 indicate conductive films which sandwich a dielectric material (diffusible material 2 in this example) to form a capacitor 3. Further, the abbreviation "Tr" indicates a transistor portion, and particularly in this example, it indicates a MOS transistor. In this specification document, the abbreviation "MOS" is used as a generic term for the structure of conductive material/insulation material-semiconductors, and is not limited to the structure of metal-oxide semiconductors. The numeral 61 indicates an elemental-device-separating region, and specifically, a LOCOS oxide film. The numeral 62 indicates an interlayer insulating film formed on a gate electrode 7 and serving as a component of the transistor Tr. The numeral 63 indicates an interlayer insulating film on the capacitor 3. Identical numerals indicate identical components in all drawings.

As described above, diffusion of a diffusible material can cause various problems in a method for manufacturing a semiconductor device in which a step of forming an opening such as a contact hole and a heat treatment step such as contact annealing are included, and the diffusible material in the device structure may diffuse through the opening due to heat during the heat treatment.

SUMMARY OF THE INVENTION

Accordingly, the object of the present invention to solve the above-described problems, and to provide a method for manufacturing a semiconductor device, wherein said method includes a heat treatment step after a step of forming an opening, and is free from disadvantages due to the above-described diffusion even if the method is applied to manufacture of a semiconductor device having a structure in which a diffusible material may diffuse through such an opening by heating during the heat treatment.

The method of the present invention for manufacturing a semiconductor device includes a step of forming an opening and a heat treatment step thereafter, and is employed for manufacturing a semiconductor device having a structure in which a diffusible material may diffuse through the opening due to heat during the heat treatment, wherein said heat treatment is performed on condition that said opening is filled.

Typically, the "heat treatment" is external heating such as annealing by a heating means, and in addition, includes any event which brings a temperature increase capable of causing diffusion of the above-described diffusible material. For example, an etching process or a deposition process according to CVD or the like can increase the temperature of a diffusible material, and such a process is also included in the scope of the "heat treatment".

According to the present invention, diffusion of the diffusible material through the opening can be inhibited since the heat treatment is carried out on condition that the opening is filled.

DESCRIPTION OF THE PREFERRED EMBODIMENT

In the following, an embodiment of the present invention will be illustrated in detail, and a preferred example of the method according to the present invention will be illustrated with reference to the drawings. As a matter of course, the present invention is not limited to such an embodiment.

In the present invention, the method for manufacturing a semiconductor device includes a step of forming an opening and a heat treatment step thereafter during which a diffusible material contained in the device structure can diffuse through the opening due to heat, wherein said heat treatment step is carried out on condition that said opening is filled. This method may also include a step of removing the filler in said opening after said heat treatment step. Needless to say, (such a step of removing the filler can be omitted in a case where the filler has no undesirable affect) as it is, or the filler is made to serve as a certain structural member.

In the present invention, the opening may be filled by forming a film comprising a diffusion-preventing material. Preferred examples of films comprising diffusion-preventing materials include silicon nitride films, silicon nitride/silicon dioxide composite films, polysilicon films, and silicon/silicon dioxide composite films.

The method of the present invention is preferably employed for a case where the diffusible material is a dielectric material for a component of a capacitor since the above-described problems due to diffusion are serious in such a case. In this case, when the opening is a contact hole connecting a diffusion layer and an electrode of the above-described capacitor in the semiconductor device, the present invention is further effective.

An example of the method according to the present invention will be illustrated in detail below with reference to the drawings. In the example described below, a non-volatile memory device FE-RAM is manufactured, and the diffusible material consists of elements as components of a ferroelectric material used in its capacitor. Needless to say, the present invention is not limited to such a case, and can be widely applied. For example, the present invention can be applied to manufacture of DRAM or the like in which similar diffusion may occur, or to a case where diffusion through an opening may occur due to heat treatment after the step of forming the opening.

EXAMPLE 1

Figure 1:
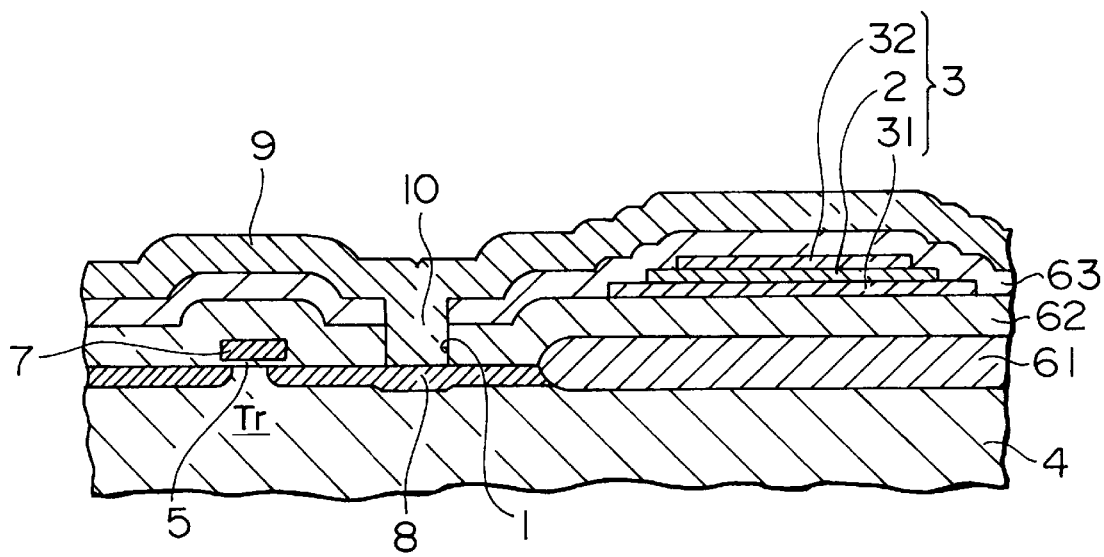
FIG. 1 is a principal sectional view illustrating the method of Example 1 according to the present invention, and corresponds to the step (2) in Example 1.

An example method according to the present invention will be illustrated with reference to FIGS. 1, 2 and 4. FIG. 1 shows the most characteristic step of this example method. Specifically, in this example, an opening 1 is formed which is a contact hole for connecting a diffusion layer 8 of a transistor Tr to a capacitor electrode, after which, a diffusion-preventing film 9 is formed to fill the opening 1 (contact hole) by heat treatment (hereupon, contact annealing) aimed at preventing diffusion of the component material (diffusible material 2) in a ferroelectric thin-film of a capacitor 3. The filler portion is indicated by the numeral 10. Accordingly, just before heat treatment, i.e., contact annealing, the semiconductor device on manufacture has a sectional structure as shown in FIG. 1.

In this example, since the opening 1 (contact hole) has been filled by forming the diffusion-preventing film 9 before contact annealing, the component material (diffusible material 2) of the ferroelectric thin-film in capacitor 3 can be prevented from diffusing during contact annealing as the heat treatment. Accordingly, the problems due to diffusion through an opening 1, which may occur by heating in a case using a diffusion material, can be solved.

Next, each step of this example method for manufacturing a semiconductor device will be illustrated in order. Initially, FIG. 2 is referred to. In this example, as preceding steps, a semiconductor substrate 4 is prepared (herein, a silicon substrate); an elemental-device-separating region 61 is then formed on the substrate according to a LOCOS patterning technique or the like such as a selective oxidization technique using an oxidization resistant film such as a silicon nitride film; the oxidization resistant film is removed by RIE or the like; a resist mask is then formed by a photoresist technique; and ion implantation for a well region or the like is carried out by ion injection. Further, a gate insulating film 5 is formed according to gate oxidation or the like. Subsequently, a gate electrode 7 is formed as a semiconductor member, namely, a gate member, in the form of a polysilicon film or a so-called polycide film by CVD or the like using a silicide/polysilicon compound such as tungsten silicide/polysilicon. After a gate structure comprising the gate insulating film 5 and the gate electrode 7 is thus formed, a diffusion layer 8 is formed. The diffusion layer 8 is a member of a MOS transistor, and can be formed, for example, according to low-concentration ion-implantation for forming a LDD structure or high-concentration ion-implantation, or by forming a sidewall spacer.

Further, an interlayer insulating film 62 is formed on the gate structure comprising said insulating film 5 and gate electrode 7. This interlayer insulating film 62 is formed by, for example, deposition such as CVD using silicon dioxide. A capacitor 3 having a structure which comprises a conductive film 31, a dielectric material (diffusible material 2) and a conductive film 32 disposed in this order on the substrate is formed in a position predetermined on the interlayer insulating film 62 and above the elemental-device-separating region 61. This capacitor 3 may be formed according to any ordinary means for forming capacitors 3 of this type. For example, the capacitor 3 having a structure which comprises a conductive film 31, a dielectric material (diffusible material 2) and a conductive film 32 can be formed by deposition and patterning of Pt or the like, deposition and patterning of the dielectric material, and deposition and patterning of Pt or the like. In this example, a ferroelectric material PZT (Pb—Zr—Ti-based material) or SBT (Sr—Bi—Ta-based material) is used as a dielectric material. An insulating film 63 is then formed on the thus formed capacitor 3. This insulating film 63 can also be formed by, for example, deposition such as CVD using silicon dioxide.

Subsequently, an opening 1 is formed which is to be a contact hole for achieving contact between the transistor Tr and the diffusion layer 8. The opening 1 (contact hole) may be formed by etching using a resist mask which is formed according to an ordinary resist and photolithography process. For forming such a MOS structure of this type, supplemental-ion implantation is performed after the step of forming the contact hole (opening 1) on the diffusion layer 8 relating to the transistor Tr in order to improve the junction properties, and succeedingly, a heat treatment step (contact annealing) is performed for activation of the impurities. Also in this example, supplemental-ion implantation is performed after the opening 1 (contact hole) is formed. FIG. 2 shows the stage when the supplemental-ion implantation is performed. The mark II in FIG. 2 indicates the contact ion implantation (supplemental-ion implantation). After this ion implantation, although a heat treatment step (contact annealing) should be performed for activation of the impurities also in this example, the following step is previously performed in this example according to the present invention.

Figure 2:
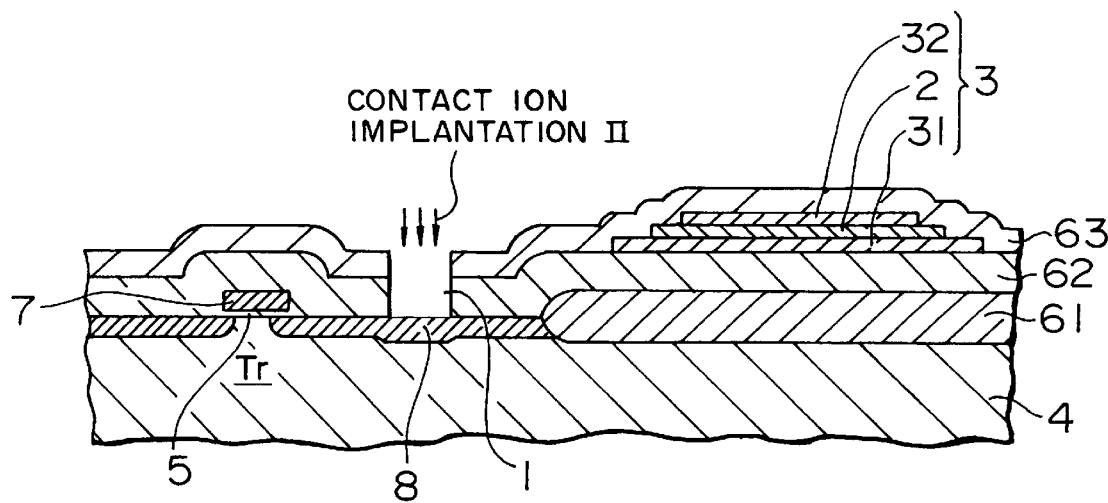
FIG. 2 is a sectional view illustrating the step (1) of Example 1.

As shown in FIG. 1, after the contact ion implantation II shown in FIG. 2, the opening 1 (contact hole) is filled by forming a film 9 comprising a diffusion-preventing material. Upon such condition that a filler portion 10 comprising a diffusion-preventing material has been formed in the opening 1 (contact hole), the heat treatment (herein, contact annealing) is carried out. Ordinarily, the heat treatment as contact annealing should include heating to 800° C. or more. Hitherto, elements as components of a dielectric material (diffusible material 2) would diffuse by such heating to 800° C. or more. In this example, however, diffusion through the opening 1 (contact hole) can be prevented since the opening 1 (contact hole) is filled by forming the film 9 comprising a diffusion-preventing material.

In this example, a silicon nitride film (or silicon nitride/silicon dioxide composite film) or a polysilicon film (or a silicon/silicon dioxide composite film) is deposited as a diffusion-preventing film 9 which forms the filler portion 10. Specifically, oxidation for buffering is carried out to a degree of approximately 5 nm, after which, deposition is performed, for example, according to CVD of polysilicon or silicon nitride. The film thickness is adjusted such that the elements in the ferroelectric material as a diffusible material 2 do not reach the semiconductor substrate 4 (silicon substrate) through the opening 1 (contact hole) under the conditions for contact annealing. According to the above-described manner, a semiconductor device can be obtained which is free from change in transistor properties and deterioration in reliability, namely, free from property deterioration such as increase in junction leakage, decrease in gate breakdown voltage, and change in threshold.

Figure 3:
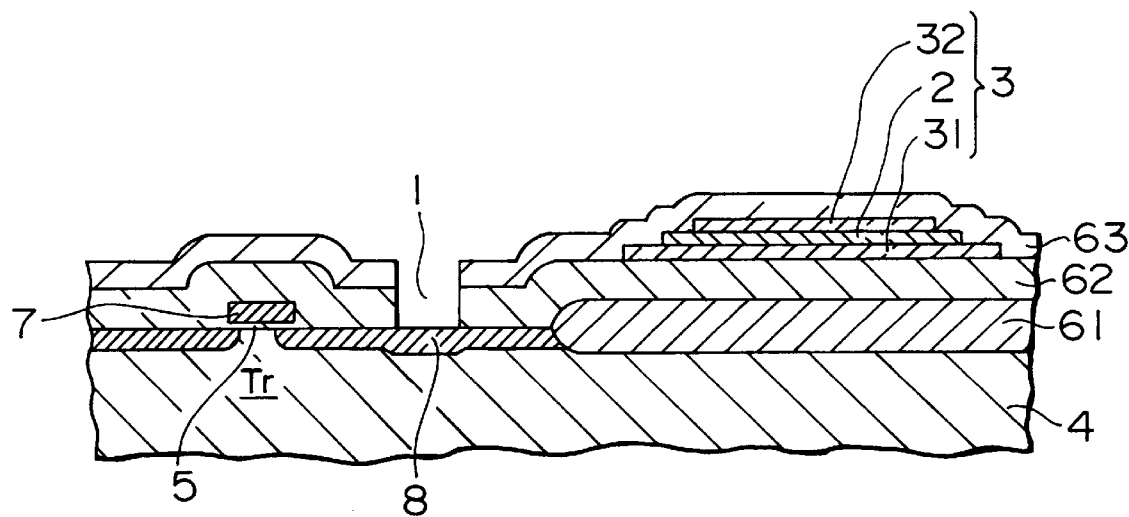
FIG. 3 is a sectional view illustrating the step (3) of Example 1.

After annealing, in this example, the diffusion-preventing film 9 which is no longer necessary is removed together with the filler portion 10 by etching. This etching can be performed under any appropriate and ordinary etching conditions suitable to the material to be etched (namely, polysilicon, silicon nitride, or the like). Additionally, the oxide film for buffering (silicon dioxide) is also removed with dilute hydrofluoric acid, and thereby, the structure shown in FIG. 3 is achieved.

Figure 4:
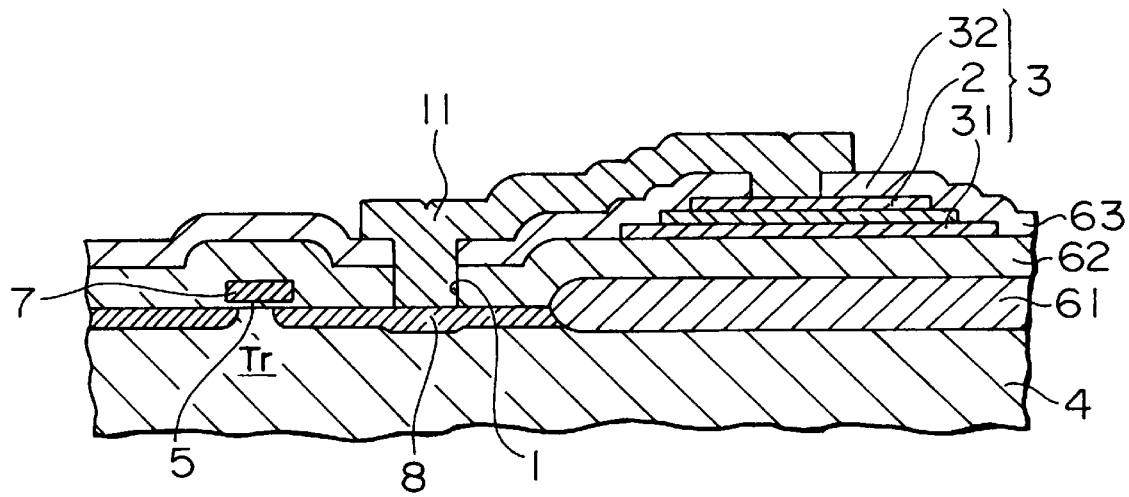
FIG. 4 is a sectional view illustrating the step (4) of Example 1.
Figure 5:
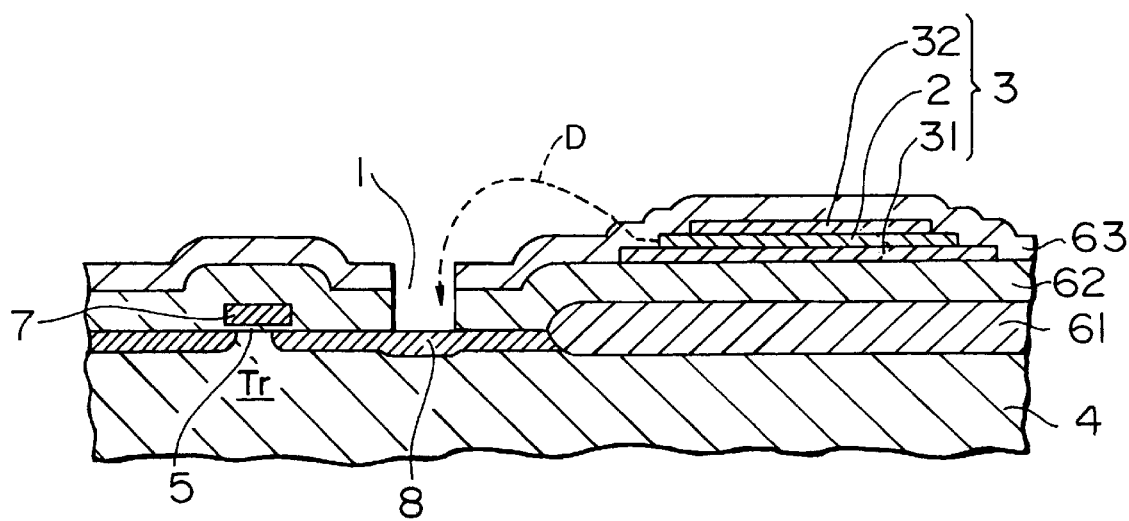
FIG. 5 is a sectional view illustrating the problems of the prior art.

After this, according to a manner similar to the prior art, a wiring pattern 11 is formed with a metal or the like such as aluminum-based materials to achieve the structure shown in FIG. 4. In the structure, satisfactory contact is achieved between the transistor Tr and the diffusion layer 8 without problems due to diffusion.

Succeedingly, a process similar to a device process for manufacturing a conventional semiconductor device is performed to obtain a desired semiconductor device (herein, a non-volatile memory device FE-RAM).

As described above, according to the present invention, a method for manufacturing a semiconductor device can be achieved which includes a heat treatment step after a step of forming an opening, and is free from disadvantages due to diffusion of a diffusible material, even if the method is applied to manufacture of a semiconductor device having a structure including the diffusible material which may diffuse through the opening due to heat during such a heat treatment step.

What is claimed is:

1. A method for manufacturing a semiconductor device comprising steps of:

forming at least a part of a first elemental device and a part of a second elemental device on a substrate, said first elemental device including a layer which contains a diffusible material:

forming an insulating film so as to cover at least a part of said first elemental device and a part of said second elemental device, said insulating film having an opening;

filling said opening with a diffusion-preventing material which prevents diffusion of said diffusible material, said diffusion-preventing material being selected from the group consisting of silicon nitride/silicon dioxide composite films, polysilicon films and silicon/silicon dioxide composite films;

heat-treating said substrate;

removing said diffusion-preventing material after said heat-treating step; and forming an electrode in said opening after said removing step.

2. The method for manufacturing a semiconductor device according to claim 1, wherein said diffusion-preventing material also forms a film covering at least a part of said first elemental device.

3. The method for manufacturing a semiconductor device according to claim 1, wherein said layer containing a diffusible material is a dielectric layer for a capacitor.

4. The method for manufacturing a semiconductor device according to claim 3, wherein said opening is a contact hole which electrically connects said second elemental device to said dielectric layer.

5. The method for manufacturing a semiconductor device according to claim 1, wherein said layer containing a diffusible material comprises a Pb—Zr—Ti-based material.

6. The method for manufacturing a semiconductor device according to claim 1, wherein said layer containing a diffusible material comprises a Sr—Bi—Ta-based material.

7. A method for manufacturing a semiconductor device comprising steps of:

forming at least a part of an elemental device on a substrate, said elemental device including a layer which contains a diffusible material;

forming an insulating film so as to cover at least a part of said elemental device, said insulating film having an opening;

filling said opening with a diffusion-preventing material which prevents diffusion of said diffusible material, said diffusion-preventing material being selected from the group consisting of silicon nitride/silicon dioxide composite films, polysilicon films and silicon/silicon dioxide composite films;

heat-treating said substrate;

removing said diffusion-preventing material after said heat-treating step; and forming an electrode in said opening after said removing step.

8. A method for manufacturing a semiconductor device comprising steps of;

forming at least a part of a transistor on a substrate;

forming a capacitor on said substrate, said capacitor comprising a pair of electrodes and a dielectric layer disposed therebetween;

forming an insulating film so as to cover said transistor and said capacitor, said insulating film having an opening;

filling said opening with at least one diffusion-preventing film selected from the group consisting of a silicon nitride/silicon dioxide composite film, a silicon/silicon dioxide composite film and a polysilicon film;

heat-treating said substrate;

removing said diffusion-preventing film after said heat-treating step; and forming an electrode in said opening after said removing step.

* * * * *